United States Patent

Mushiage et al.

Patent Number: 5,933,443
Date of Patent: *Aug. 3, 1999

[54] SEMICONDUCTOR LASER

[75] Inventors: Masato Mushiage; Yuta Tezen; Minoru Murayama, all of Kyoto, Japan

[73] Assignee: Rohm Co., Ltd., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/707,532

[22] Filed: Sep. 4, 1996

[30] Foreign Application Priority Data

Sep. 8, 1995 [JP] Japan .................................. 7-231192

[51] Int. Cl.⁶ ....................................................... H01S 3/19
[52] U.S. Cl. ............................................. 372/46; 372/45
[58] Field of Search ........................................ 372/46, 45

[56] References Cited

U.S. PATENT DOCUMENTS

| | | | |
|---|---|---|---|
| 5,144,633 | 9/1992 | Ohnaka et al. | 372/45 |
| 5,146,467 | 9/1992 | Kadowaki et al. | 372/46 |
| 5,386,429 | 1/1995 | Naito et al. | 372/46 |

FOREIGN PATENT DOCUMENTS

| | | | |
|---|---|---|---|
| 1-187988 | 7/1989 | Japan | 372/46 |
| 3-161987 | 7/1991 | Japan | 372/46 |
| 3-225918 | 10/1991 | Japan | 372/46 |
| 4-115588 | 4/1992 | Japan | 372/46 |
| 4-218993 | 8/1992 | Japan . | |
| 5-37078 | 2/1993 | Japan | 372/46 |

*Primary Examiner*—Rodney Bovernick
*Assistant Examiner*—Yisun Song
*Attorney, Agent, or Firm*—Nikaido, Marmelstein, Murray & Oram, LLP

[57] ABSTRACT

A semiconductor laser including a first conductive type of lower clad layer, active layer, a second conductive type of upper first clad layer, the first conductive type of current blocking layer having a stripe shaped open portion, and the second conductive type of upper second clad layer laminated in order on the first conductive type of GaAs substrate, wherein each portion in contact with the lower clad layer, the active layer, the upper first and second clad layer and at least the upper second clad layer of the current blocking layer is composed of a compound semiconductor to be represented by a formula, in which $(Al_xGa_{1-x})_yIn_{1-y}P$ (x is $0<x \leq 1$ in the lower and upper first, second clad layers, $0 \leq x < 1$ in the active layer, a given value y is approximately 0.5 for each layer) within of each range of $0<x \leq 0.75$ in the portion in contact with the upper second clad layer of the current blocking layer.

2 Claims, 4 Drawing Sheets

SEMICONDUCTOR LASER

BACKGROUND OF THE INVENTION

The present invention relates to a semiconductor laser. More particularly, the present invention relates to a visual light semiconductor laser using a compound semiconductor material of AlGaInP.

The semiconductor laser using the compound semiconductor material, basically manufactured by laminated semiconductor layers having different compositions, requires steps of, except a step of semiconductor crystal layer growth, grasping etching or the like halfway although depending upon the shape thereof. Since the semiconductor wafer has to take out from a crystal growing furnace, the frequency of grasping the steps is better to be fewer in terms of productivity. Although it is general at present to take out the wafer twice halfway from the crystal growing furnace in the three continuous crystal growth steps, namely, before the uppermost semiconductor layer is completed in crystal growth, semiconductor lasers capable of being manufactured only with two steps of continuous crystal growing steps are disclosed in, for example, pages 1491 through 1496 (hereinafter referred to as document) IEEE Journal of Quantum Electronics) Volume 27, No. 6, July 1991 or in Japanese Unexamined Patent Publication No. 218993/1992. One of the representative semiconductor lasers in the above description are shown in FIG. 3 and FIG. 4.

FIG. 3 shows a semiconductor described in the document, where an n-type of AlGaInP clad layer 22, an n-type, a p-type or non-dope of GaInP active layer 23, a p-type of AlGaInP clad layer 24, and an n-type of GaAs current blocking layer 25 are laminated in order on an n-type of GaAs substrate 21.

Then, a stripe shaped groove reaching to the middle of the clad layer 24 through the current blocking layer 25 is formed, etching these layers. Further, a p-type of AlGaInP light guide layer 26, a p-type of AlGaInP clad layer 27, a p-type of InGaP layer 28, a p-type GaAs contact layer 29, and an AuZn/Au electrode 30 are laminated in order in the layer. AuGe/Au electrode 31 is provided on the reverse face to constitute the semiconductor laser.

Also, FIG. 4 shows another example of the conventional semiconductor laser described in the Japanese Unexamined Patent Publication No. 218993/1992. In the semiconductor laser described in FIG. 4, an n-type of AlGaInP clad layer 42, GaInP active layer 43, a p-type AlGaInP clad layer 44, a p-type of GaInP etching stop layer 45, a p-type of AlInP shutting in (or confining) layer 46, and an n-type GaAs current blocking layer 47 are laminated in order on an n-type GaAs substrate 41. Then, the current blocking layer 47 and the shutting in layer 46 are etched from the surface, forming a stripe shaped stripe groove reaching onto the surface of the etching stop layer 45. Further, a p-type of AlGaAs upper clad layer 48, a p-type of GaAs cap layer 49, and a Cr/Au electrode 50 are laminated in order. An Au/Ge/Ni electrode 51 is provided on the reverse face.

Such a conventional semiconductor laser has a problem in that the surface of the GaAs is deteriorated when the substrate temperature is raised under the atmosphere of $PH_3$ gas at the next re-growing time in the use of GaAs or the like where an energy band gap is small having a light absorbing function as a current blocking layer so that the semiconductor crystal layer of the AlGaInP including P cannot be grown again in a good crystal condition.

Also, a larger mixed crystal ratio of Al, for example, AlInP is desired to be used in the current blocking layer for provision of light shutting-in function without light absorption. There is another problem in that the degree of freedom in designing of the semiconductor laser is restricted, because better crystal of the AlGaInP to be re-grown cannot be obtained on it where the mixed crystal ratio of the Al is big as shown in Table 2 to be described later.

SUMMARY OF THE INVENTION

An object of the present invention is to settle such problems as described hereinabove and further, to provide a semiconductor laser superior in characteristics where better crystal is obtained in the case of re-growing a second clad layer composed of AlGaInP after the formation of the inner stripe type of current blocking layer even in use of any material for current blocking layer in accordance with the design object of the semiconductor laser.

The semiconductor laser of the present invention has a first conductive type of lower clad layer, active layer, a second conductive type of upper first clad layer, the first conductive type of current blocking layer having a stripe shaped open portion, and the second conductive type of upper second clad layer laminated in order on the first conductive type of GaAs substrate. Each portion in contact with the lower clad layer, the active layer, the upper first and second clad layer and at least the upper second clad layer of the current blocking layer is composed of a compound semiconductor to be represented by a formula, in which $(Al_xGa_{1-x})_yIn_{1-y}P$ (x is $0 < x \leq 1$ in the lower and upper first, second clad layers, $0 \leq x < 1$ in the active layer, a given value y is approximately 0.5 for each layer) within of each range of $0 < x \leq 0.75$ in the portion in contact with the upper second clad layer of the current blocking layer.

The first conductive type, and the second conductive type mean that the other of the p-type or the n-type is the second conductive type when one of the n-type or the p-type is the first conductive type.

Also, in the current blocking layer, the larger value of x, namely, the larger composition of Al in the active layer, is preferable to have a function of light shut-in without absorption of the light.

Also, for easier adjustment of the refractive index as the overall current blocking layer in the remaining portion, a portion to be represented by a composition formula of the current blocking layer: $(Al_xGa_{1-x})_yIn_{1-y}P$ ($0 < x \leq 0.75$, y is approximately 0.5) is preferable to be a semiconductor layer 300 Å or lower.

Further, it is preferable in terms of an object of having the light absorbing function that the current blocking layer contains the semiconductor layer composed of GaAs within the layer.

According to the semiconductor laser of the present invention, a semiconductor laser superior in characteristics is obtained because of such construction as composed of semiconductor having Al composition of $0 < x \leq 0.75$ in the composition formula: $(Al_xGa_{1-x})_yIn_{1-y}P$ in at least the uppermost face of the current blocking layer, because crystal property of epitaxial layer to be re-grown on it after the etching of the current blocking layer or the Al composition in the re-growth semiconductor layer is selectable freely.

Also, the uppermost layer is made 300 Å or lower in thickness so that 1/10 or lower of the overall current blocking layer in thickness. The degree of freedom in designing the semiconductor laser is expanded independently of influences upon the refractive index or the like as the current blocking layer.

DETAILED DESCRIPTION

A semiconductor laser of the present invention will be described hereinafter according to one preferred embodiment of the present invention. FIG. 1(a), FIG. 1(b), FIG. 1(c) and FIG. 1(d) are sectional illustrating views of a first embodiment of the semiconductor laser of the present invention in accordance with the manufacturing steps.

Figure 1A:
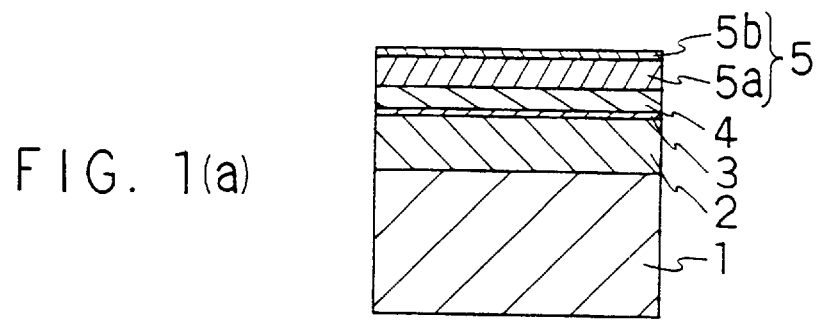
FIGS. 1(a) to 1(d) are sectional views showing a first embodiment of a semiconductor laser of the present invention explaining in accordance with a producing method.

In the step of FIG. 1(a), each layer of an n-type of $(Al_sGa_{1-s})_yIn_{1-y}$ ($0.4 \leq s \leq 1.0$, y is approximately 0.5 which is a ratio where a lattice matching is obtained with respect to the GaAs substrate. Hereinafter, representation of y is omitted), a first conductive type of lower clad layer 2 (for example, s=0.5, approximately $1 \times 10^{18}/cm^3$ in carrier concentration, approximately 1.2 μm in thickness, Se dope), on the surface of, for example, an n-type of GaAs substrate 1, a non-dope or an n-type or a p-type of $Al_uGa_{1-u}InP$ ($0 \leq u \leq 0.4$, u<s) active layer 3 (for example, u=0, approximately 0.07 μm in thickness), a second conductive type of upper first clad layer 4 of, for example, a p-type of $Al_sGa_{1-s}$ InP (for example, s=0.5, approximately $1 \times 10^{18}/cm^3$ in carrier concentration, approximately 0.2 μm in thickness, Be dope), an n-type of AlInP first current blocking layer 5a (for example, $2 \times 10^{18}/cm^3$ in carrier concentration, approximately 0.3 μm in thickness, Se dope), and a second current blocking layer 5b of an n-type $Al_tGa_{1-t}InP$ ($0<t \leq 0.75$) (for example, t=0.5, approximately $2 \times 10^{18}/cm^3$ in carrier concentration, approximately 0.03 μm in thickness, Se dope) is lattice matched on the n-type GaAs substrate 1 and grown in crystal in order by a MOVPE (metal organic vapor phase epitaxy) method.

The semiconductor laser of the present invention has the upper first clad layer 4, the first and second current blocking layers 5a, 5b formed of a material larger than the energy band gap in the active layer 3 in the energy band gap. Thus, the luminous efficiency can be raised, because the absorption of the light in the upper first clad layer 4 and the current blocking layer 5 can be prevented. An adjustment operation as a material large in the energy band gap can be effected, because the energy band gap becomes larger as the amount of Al (or X) is larger if the $Al_xGa_{1-x}InP$ is used as the semiconductor. When the $Al_uGa_{1-u}InP$ is used as the active layer, large mixed crystal ratio of Al such as AlInP or the like can be used.

Figure 1B:
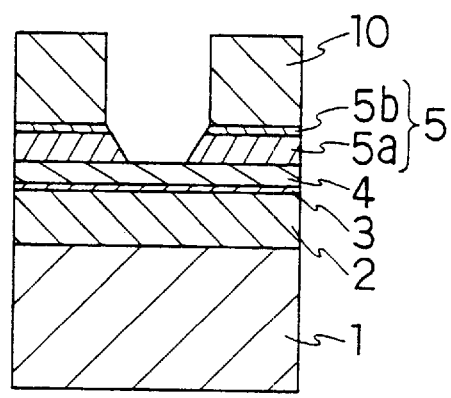

In the step of FIG. 1(b), the substrate is taken out from the growth chamber. In the photo resist step, a master pattern of, for example, approximately 3 μm in width is formed. The substrate is etched from the surface in width, and a stripe shaped groove reaching to the upper first clad layer 4 is formed. As an etchant, for example, $HCl:H_2O=1:2$ (25° C.) is used to effect the etching operation for about 30 seconds. The etchant may be a mixed liquid among HCl, $HNO_3$ and $H_2O$.

The selection etching of the current blocking layer is easier to operate as shown from data shown in Table 1, because the Al composition of the current blocking layer in the present invention is larger than the Al composition of the upper first clad layer.

Namely, the current blocking layer 5 to be etched by the etchant can be effected easily with better reproducibility, because the selection ratio with respect to the upper first clad layer whose surface is exposed by the etching is near 10 as shown in Table 1. Therefore, the semiconductor laser which is better in reproducibility and is suitable for mass production is obtained.

TABLE 1

Etching velocity of $(Al_xGa_{1-x})_{0.5}In_{0.5}P$ (T = 25° C.)

| $HCl:H_2O$ x | 1:1 | 1:2 | 1:4 |
|---|---|---|---|
| 0 | 600Å/min | 0Å/min | 0Å/min |
| 0.2 | 1600Å/min | 60Å/min | 0Å/min |
| 0.5 | 10800Å/min at least | 900Å/min | 150Å/min |
| 0.75 | 5 μm/min at least | 8300Å/min at least | 1500Å/min |
| 1.0 | 5 μm/min | 5 μm/min | 12300Å/min |

Figure 1C:
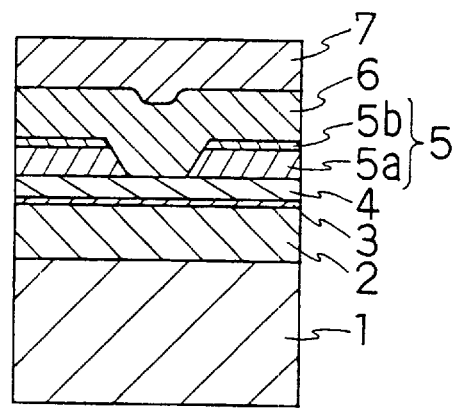

Then, in the step of FIG. 1(c), the substrate is introduced again to the MOCVD apparatus through the removing, and washing of the resist film 10. The p-type $Al_sGa_{1-s}InP$ upper second clad layer 6 (for example, s=0.5, approximately $1 \times 10^{18}/cm^3$ in carrier concentration, approximately 1.0 μm in thickness, Be dope), and a p-type of GaAs cap layer 7 (for example, approximately $2 \times 10^{19}/cm^3$ in carrier concentration, approximately 1.6 μm in thickness) are grown in crystal on all the surface.

There is found out upon eager consideration for improving the crystal property of the upper second clad layer 6 to be grown epitaxially on the current blocking layer 5 that $(Al_sGa_{1-s})InP$ to be laminated on it is re-grown again in a good condition by the restriction of the Al composition of the current blocking layer to a certain ratio or lower. Namely, the result of the crystal property investigated through the change in the Al composition (t and s) is shown in Table 2, where the crystal property at the re-growth time of $(Al_sGa_{1-s})InP$ on the $(Al_tGa_{1-t})InP$ is usable if $t \leq 0.75$ and more preferably $t \leq 0.5$.

TABLE 2

Surface state of $(Al_sGa_{1-s})_{0.5}In_{0.5}P$ re-grown on $(Al_tGa_{1-t})_{0.5}In_{0.5}P$

| re-grown t | 0 | 0.2 | 0.5 | 0.75 | 1.0 |
|---|---|---|---|---|---|
| 0 | ○ | ○ | ○ | ○ | ○ |
| 0.2 | ○ | ○ | ○ | ○ | ○ |
| 0.50 | ○ | ○ | ○ | ○ | Δ |
| 0.75 | Δ | Δ | Δ | Δ | x |
| 1.0 | x | x | x | x | x |

○: There are few defects, the half-value width of X-ray is narrow and crystal property is good.

Δ: There are some defects, but the half-value width of X-ray is narrow and crystal property is good.

x: There are many defects, the half-value width is wide and crystal property is not good.

Also, the carrier concentration is made higher so that the thickness of the current blocking layer 5 can be made as comparatively thin as 0.2 μm through 0.4 μm, and the stage difference may be made smaller, thus making it hard to have defects during the re-growth time. By the use as a p-type dopant of Be where change in adherence amount by the substrate temperature is comparatively smaller, elements of low operating voltage may be manufactured with better reproducibility.

Further, since in the present invention, the semiconductor of AlGaInP all on the surface at the re-growth step time is not a semiconductor of GaAs after the etching step has been carried out halfway, the substrate temperature can be raised under phosphine ($PH_3$) gas atmosphere. In this case, better re-grow can be carried out without deterioration of the surface.

When bis(methylcyclopentadienyl)berylium $(CH_3C_5H_4)_2$ Be is used as metal organic metal for feeding Be of the p-type of dopant, the substrate temperature hardly changes even at 600° through 650° C. in the epitaxy growth of, for example, GaS. When dimethyl zinc (DMZn) is used with Zn as a p-type of dopant as before, considerable improvement is provided as compared with one few-th in the carrier concentration in the temperature zone.

Figure 1D:
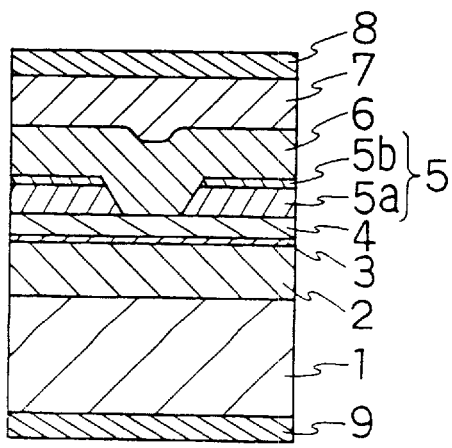

Finally, in the step of FIG. 1(d), the n-type of GaAs substrate 1 is polished from the reserve face. In the steps up to FIG. 1(c), the overall thickness including the semiconductor layer laminated on the surface of the substrate 1 is made approximately 60 μm. For example, Ti/Au is formed on the surface of the substrate 1, and for example, laminated ohmic electrodes 8, 9 are respectively formed on the reverse face to cleave for chipping.

A second embodiment of the semiconductor laser of the present invention will be described hereinafter with the use of FIG. 2. The semiconductor laser in the second embodiment is same in sectional construction except for difference in the number of the semiconductor layers for constituting the current blocking layer although there is some difference with respect to the above described first embodiment in thickness of each layer and the composition. The like parts are designated by like reference numerals in FIG. 1 and FIG. 2.

Figure 2A:
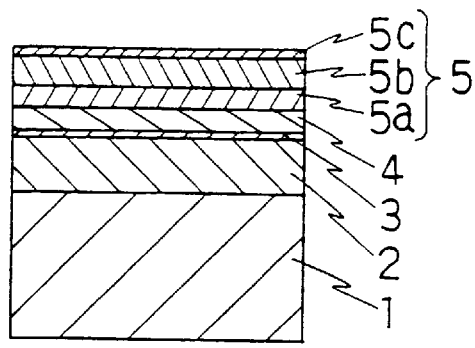
FIGS. 2(a) to 2(d) are sectional views showing a second embodiment of a semiconductor laser of the present invention explaining in accordance with a producing method.

In the step of FIG. 2(a), each layer of an n-type $(Al_sGa_{1-s})_yIn_{1-y}$ P($0.4 \leq s \leq 1.0$, y is approximately 0.5 which is a ratio where the grid matching is effected to GaAs substrate. Hereinafter, representation of y is omitted) first conductive lower clad layer 2, on the surface of, for example, an n-type GaAs substrate 1, a first conductive lower clad layer 2 (for example, s=0.5, approximately $1 \times 10^{18}/cm^3$ in carrier concentration, approximately 1.2 μm in thickness, Se dope), a non-dope or an n-type or a p-type of $Al_uGa_{1-u}InP$ ($0 \leq u \leq 0.4$, u<s) active layer 3 (for example, u=0, approximately 0.07 μm in thickness), a second conductive type of upper first clad layer 4 of, for example, a p-type of Als Ga1−s InP (for example, s=0.5, approximately $1 \times 10^{18}/cm^3$ in carrier concentration, approximately 0.2 μm in thickness, Be dope), an n-type $Al_pGa_{1-p}InP$ ($0<p \leq 0.75$) first current blocking layer 5a (for example, p=0.75, approximately $2 \times 10^{18}/cm^3$ in carrier concentration, approximately 0.1 m in thickness, Se dope), an n-type GaAs second current blocking layer 5b (approximately $5 \times 10^{18}/cm^3$ in carrier concentration, approximately 0.2 μm in thickness, Se dope), and an n-type $Al_qGa_{1-q}InP$ ($0<q \leq 0.75$) third current blocking layer 5c (for example, q=0.5, $2 \times 10^{18}/cm^3$ in carrier concentration, approximately 0.03 μm in thickness, Se dope), are grid matched on the n-type GaAs substrate 1 and grown in crystal in order by a MOVPE (metal organic vapor phase epitaxy) method.

Figure 2B:
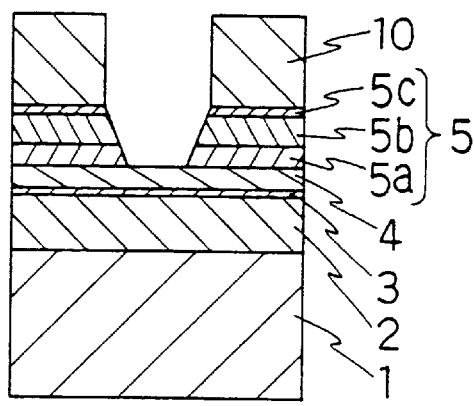
Figure 2C:
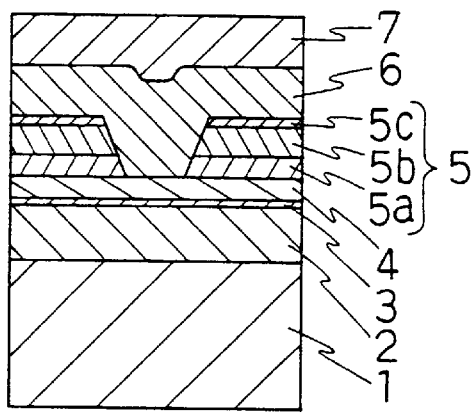
Figure 2D:
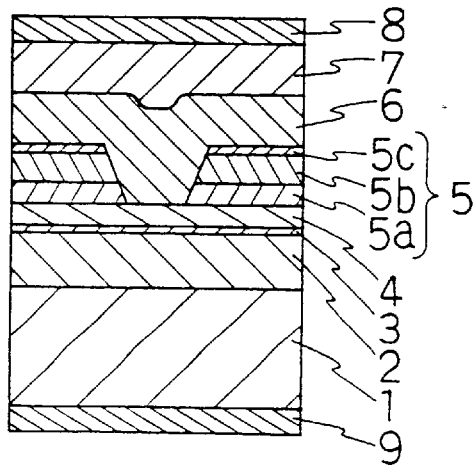
Figure 3:
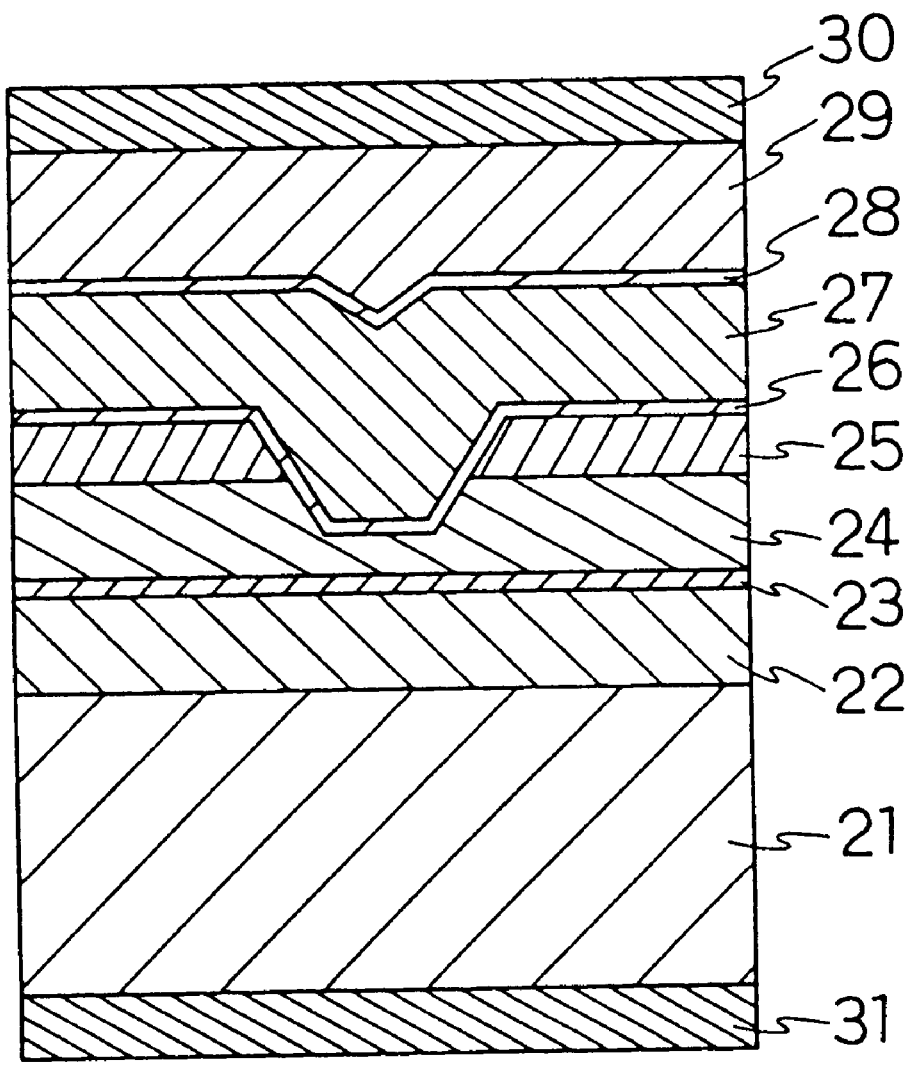
FIG. 3 is a sectional view of a conventional semiconductor laser.
Figure 4:
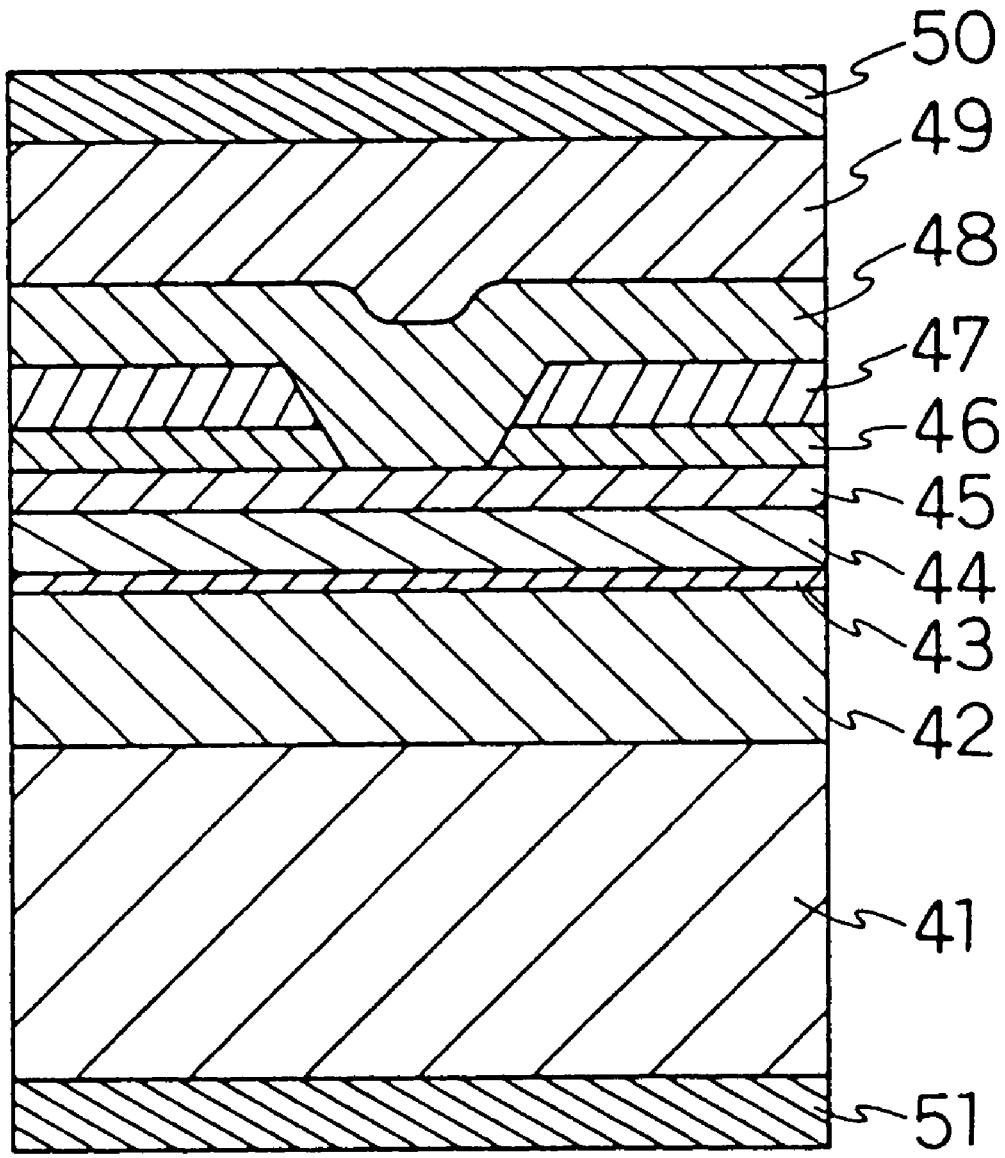
FIG. 4 is a sectional view of another conventional semiconductor laser.

Then, in the step of FIG. 2(b), the substrate is taken out from the growth chamber. In the photoresist step, a mask pattern of, for example, approximately 4 μm is formed. For example, $HCl:H_2O=1:2$ (25° C.) is used as an etchant. The third current blocking layer 5c is removed by approximately 30 seconds' etching. Since the GaAs cannot be etched in the liquid, the $H_2SO_4$ etchant is used. The 20 second's etching is effected with the use of $HCl:H_2O=1:2$ (25° C.) again so as to selectively remove the first current blocking layer 5a.

In accordance with the steps (c), (d) of the contents the same as those of the first embodiment, the semiconductor laser can be obtained. Even in the second embodiment, the substrate temperature can be raised under the $PH_3$ gas atmosphere so that the semiconductor layer surface is not deteriorated, because $Al_qGa_{1-q}InP$ covers without exposure of GaAs onto the surface when the upper second clad layer 6 is grown at the step of the (c).

According to the present invention, even in the semiconductor laser for using as the current blocking layer a material higher in mixed crystal ratio of Al such as AlInP or the like where the light shutting-in function is provided in the current blocking layer and the characteristics of the low operating current is obtained, the AlGaInP series semiconductor crystal can be better in re-growth, thus improving the productivity.

Since the AlGaInP material is laminated on the GaAs as the current blocking layer even in a waveguide type of low noise semiconductor laser of an anti-refractive index having a proper light absorption function, better crystal can be re-grown without roughing the substrate surface even in the rise in the temperature under the $PH_3$ gas atmosphere without exposure of the GaAs onto the substrate surface in the re-growth time. As a result, a highly efficient semiconductor laser of an intermediate type between the refractive index guide wave and the gain guide wave by the covering of the above with $Al_qGa_{1-q}InP$ ($0<q \leq 0.75$) with the GaAs in the current blocking layer even in the semiconductor laser using the AlGaInP semiconductor in the luminous portion.

Though several embodiments of the present invention are described above, it is to be understood that the present invention is not limited only to the above-mentioned and various changes and modifications may be made in the invention without departing from the spirit and scope thereof.

What is claimed is:

1. A semiconductor laser comprising:

a GaAs substrate of a first conductive type;

a lower clad layer of the first conductive type laminated directly on said GaAs substrate;

an active layer laminated directly on said lower clad layer;

an upper first clad layer of a second conductive type laminated directly on said active layer;

a current blocking layer of the first conductive type, having a stripe shaped open portion, laminated directly on said upper first clad layer; and an upper second clad layer of the second conductive type laminated directly on said current blocking layer and within said stripe shaped open portion, wherein said lower clad layer, said active layer, said upper first and second clad layers and at least said upper second clad layer within said stripe shaped open portion of said current blocking layer is composed of a compound semiconductor represented by a formula, in which $(Al_xGa_{1-x})_yIn_{1-y}P$ (x is $0<x \leq 1$ in said lower clad layer and said upper first and second clad layers, $0 \leq x<1$ in said active layer, a given value y is approximately 0.5 for each layer) and wherein said current blocking layer comprises an AlInP first current blocking layer formed on said upper first clad layer and an $Al_tGa_{1-t}InP$ ($0<t \leq 0.75$) second current blocking layer.

2. A semiconductor laser comprising:

a GaAs substrate of a first conductive type;

a lower clad layer of the first conductive type laminated directly on said GaAs substrate;

an active layer laminated directly on said lower clad layer;

an upper first clad layer of a second conductive type laminated directly on said active layer;

a current blocking layer of the first conductive type, having a stripe shaped open portion, laminated directly on said upper first clad layer; and an upper second clad layer of the second conductive type laminated directly on said current blocking layer and within said stripe shaped open portion, wherein said lower clad layer, said active layer, said upper first and second clad layers and at least said upper second clad layer within said stripe shaped open portion of said current blocking layer is composed of a compound semiconductor represented by a formula, in which $(Al_xGa_{1-x})_yIn_{1-y}P$ (x is $0<x\leq1$ in said lower clad layer and said upper first and second clad layers, $0\leq x\leq1$ in said active layer, a given value y is approximately 0.5 for each layer) and wherein said current blocking layer comprises an $Al_pGa_{1-p}InP$ ($0<p\leq0.75$) first current blocking layer formed on said upper first clad layer, a GaAs second current blocking layer and an $Al_qGa_{1-q}InP$ ($0<q\leq0.75$) third current blocking layer.

* * * * *